United States Patent
Wrape et al.

[11] Patent Number: 5,907,562
[45] Date of Patent: *May 25, 1999

[54] TESTABLE INTEGRATED CIRCUIT WITH REDUCED POWER DISSIPATION

[75] Inventors: Michael J. Wrape, San Diego, Calif.; Tommi Uhari, Oulu, Finland

[73] Assignee: Nokia Mobile Phones Limited, Salo, Finland

[ * ] Notice: This patent issued on a continued prosecution application filed under 37 CFR 1.53(d), and is subject to the twenty year patent term provisions of 35 U.S.C. 154(a)(2).

[21] Appl. No.: 08/690,739

[22] Filed: Jul. 31, 1996

[51] Int. Cl.$^6$ .................................................. G01R 31/28
[52] U.S. Cl. ........................................ 371/22.31; 365/201
[58] Field of Search ................................. 371/22.3, 22.1, 371/25.1, 22.5, 22.31, 22.32, 22.36, 27.5; 324/765; 365/201; 395/183.12, 183.06; 364/489, 579, 490; 326/40, 91

[56] References Cited

U.S. PATENT DOCUMENTS

| | | | |
|---|---|---|---|
| 4,137,563 | 1/1979 | Tsunoda | 364/200 |
| 4,737,666 | 4/1988 | Umeda et al. | 307/480 |
| 4,897,560 | 1/1990 | Saito et al. | 307/296.3 |
| 5,015,875 | 5/1991 | Giles et al. | 307/272.2 |
| 5,202,625 | 4/1993 | Farwell | 324/158 R |
| 5,257,267 | 10/1993 | Ishizaka | 371/22.3 |
| 5,291,080 | 3/1994 | Amagasaki | 307/475 |
| 5,300,831 | 4/1994 | Pham et al. | 307/465 |
| 5,379,302 | 1/1995 | Andrews | 371/22.3 |
| 5,457,790 | 10/1995 | Iwamura et al. | 395/494 |
| 5,467,042 | 11/1995 | Smith et al. | 327/293 |
| 5,477,493 | 12/1995 | Danbayashi | 365/201 |
| 5,477,545 | 12/1995 | Huang | 371/22.3 |
| 5,491,699 | 2/1996 | Scheuermann et al. | 371/22.1 |
| 5,497,378 | 3/1996 | Amini et al. | 371/22.3 |
| 5,519,714 | 5/1996 | Nakamura et al. | 371/22.3 |
| 5,592,493 | 1/1997 | Crouch et al. | 371/22.3 |
| 5,614,838 | 3/1997 | Jaber et al. | 324/765 |

FOREIGN PATENT DOCUMENTS

| | | |
|---|---|---|
| 0 600 594 A1 | 6/1994 | European Pat. Off. . |
| 0 628 831 A1 | 12/1994 | European Pat. Off. . |
| 0 686 977 A1 | 12/1995 | European Pat. Off. . |

OTHER PUBLICATIONS

3 Page Publication, 1983 by Addison–Wesley Publishers Limited.

*Primary Examiner*—Robert W. Beausoliel, Jr.
*Assistant Examiner*—Nadeem Iqbal
*Attorney, Agent, or Firm*—Perman & Green, LLP

[57] ABSTRACT

An integrated circuit includes a plurality of internal devices that are tested by setting the states of their data registers to respective levels, first forming a known initialization value and then a functional data value. All the data registers used for testing are coupled as one or more shift registers and by clocking data through a serial scan path, test stimuli can be shifted in and results shifted out. The scan path connections are provided in addition to the usual functional operation signal connections. During functional operation, the data transitions in the scan path signals are disabled to reduce the power dissipation associated with driving the scan path signals.

20 Claims, 5 Drawing Sheets

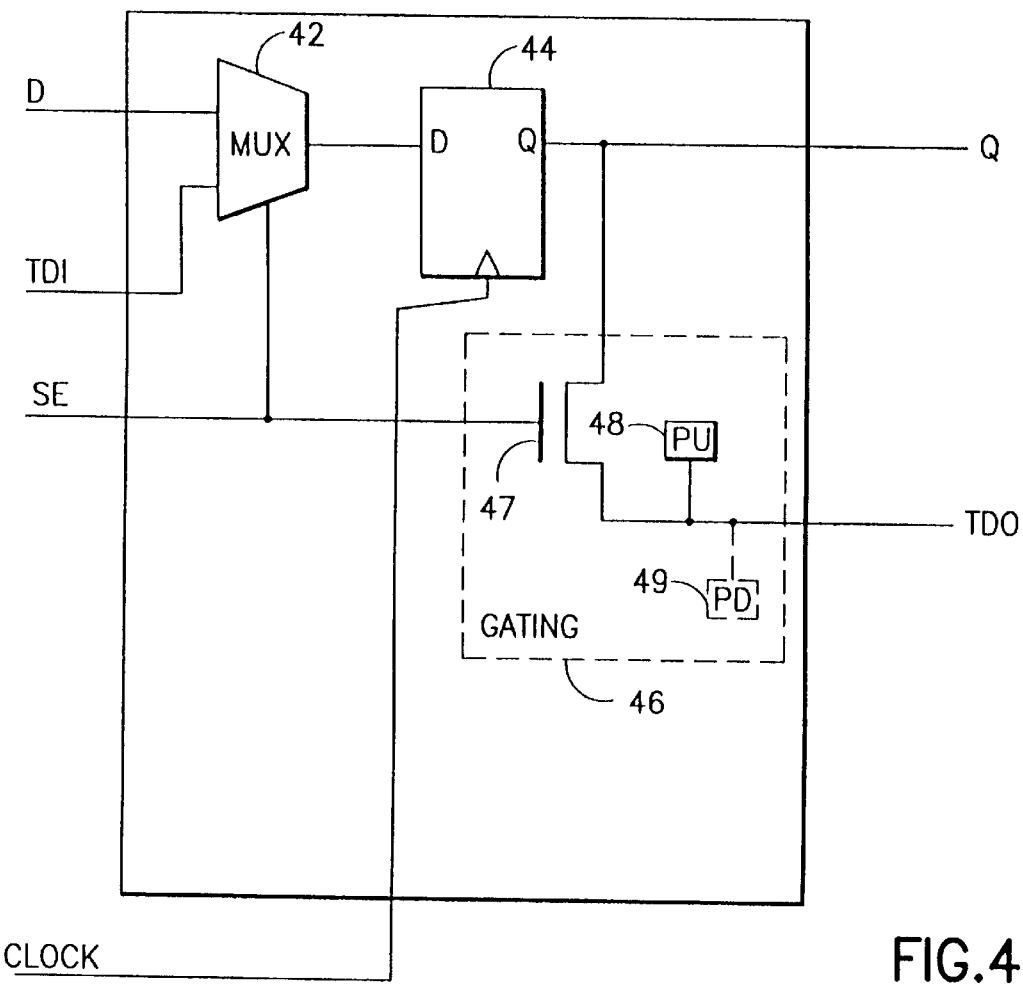
FIG.4
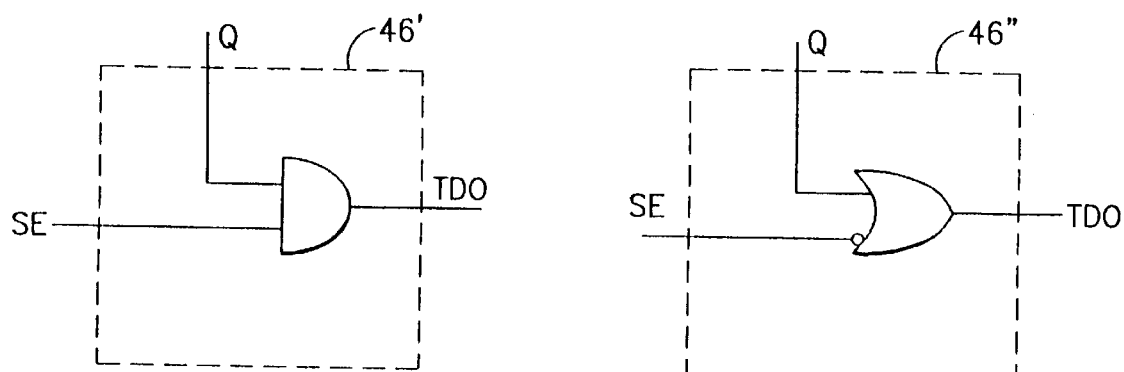
FIG.6
FIG.7

TESTABLE INTEGRATED CIRCUIT WITH REDUCED POWER DISSIPATION

BACKGROUND OF THE INVENTION

1. Field of the Invention

The present invention relates to large scale integrated circuits and more particularly to an integrated circuit using a serial scan test with reduced power dissipation.

2. Prior Art

A method used for testing integrated circuits is the scan-path built-in test structure approach. There are many variations to this approach including multiplexed scan, clocked scan, and level sensitive scan design. When incorporating scan-path capability into an integrated circuit (IC), standard register devices are replaced with modified test registers which have a test mode of operation. FIG. 1 shows such a test register 10 for a scan-path structure. The test register 10 has a test data input TDI for receiving test data input signals 11, in addition to the regular functional data input D, for receiving functional data signals 12. Conventional scan enable SE and clock inputs, for receiving scan enable signals 13 and clock signals 14, and a data output Q for output signals 15, are also provided. A series of such test registers are connected together to form a serial shift register or registers allowing test data to be loaded into all the registers in a memory or other device to set up conditions for testing. FIG. 2 shows on exemplary circuit incorporating scan-path testing. After loading test data into the test registers of a device the same scan-path path can be used to observe the result by serial shifting out the state of the registers. Controllability and observability of internal circuit nodes is achieved in this manner and is used for the purposes of fault detection. The integrated circuit may be partitioned for testing purposes into one or more serial shift register chains.

As seen in FIG. 2 conventional scan-path circuits are implemented by connecting the output signal 15 from one register 30 to the test data input TDI of another register 32. In addition to this connection, needed for scan-path capability, the output signal 15 of one register (30) is also coupled to the functional data input D of another register (32) through combinatorial logic or registers 34 to achieve the logic and control functions desired.

A source of power dissipation in an integrated circuit is the charging and discharging of capacitances which occurs when logic signals go through transitions from a high to a low voltage state or a low to a high voltage state. The circuit interconnections between gates and the MOS transistors forming gates both have capacitance that is charged and discharged when logic signals transition. When scan-path signal paths are added to an IC, there is an increase in the capacitance being driven due to the increase in the length of the interconnection and the additional gate load at the test data input of the test register. Thus, an increase in total power dissipation is experienced when scan-path capability is incorporated into an IC. In a large scale integrated circuit there are many such paths that contribute to increased power dissipation.

Further background on scan-path testing is described in Chapter 6 of Submicron ASIC Products Design for Testability Reference Guide 1993, published by Texas Instruments.

Objects

An object of the present invention is to provide an integrated circuit device with a scan-path test structure having reduced power dissipation.

SUMMARY OF THE INVENTION

In accordance with the present invention, the standard data registers of devices in an integrated circuit are converted to low power consumption test registers by providing them with a test data output, in addition to the functional data output, and arranging them in a scan path test structure wherein the scan-path mode control is used to enable or disable signal transitions of the scan-path signal paths. The test data output from one scan-path capable register provides a separate controllable test data output signal to the test data input of another such test register to form a testable shift register. The test data output signal is disabled by adding a gating device which holds the scan-path signal at a constant logic level. When the devices are in the operational or functional mode the signal transitions of the scan-path signal paths are disabled. In this way the additional power dissipation from charging and discharging the capacitance in the scan-path paths is avoided when the device is in the functional mode.

BRIEF DESCRIPTION OF THE DRAWINGS

FIG. 4 shows the details of a test register in accordance with the embodiment of FIG. 3;

FIGS. 6 and 7 show alternative forms of the gating device of FIG. 4; and

DETAILED DESCRIPTION OF THE PREFERRED EMBODIMENTS

Figure 3:
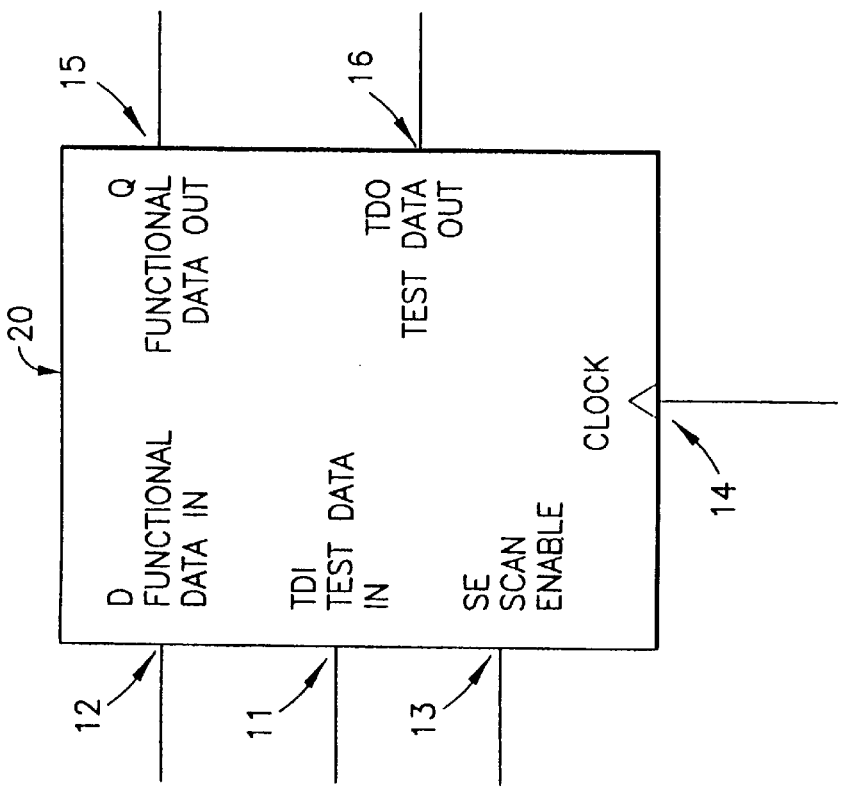
FIG. 3 is a scan-path test register in accordance with an embodiment of the present invention.
Figure 1:
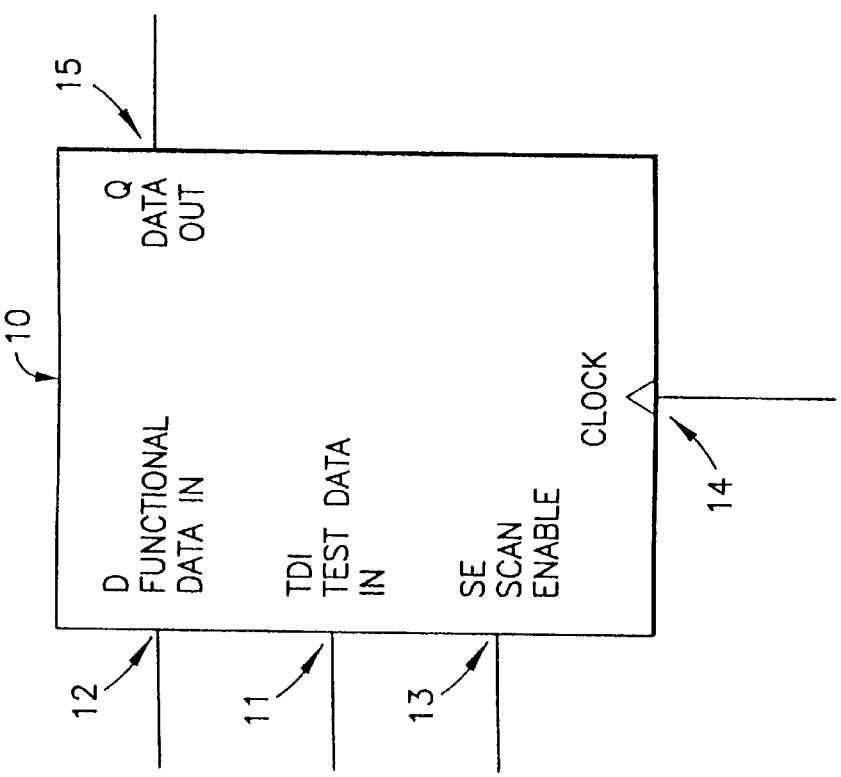
FIG. 1 is a scan-path test register in accordance with the prior art.
Figure 2:
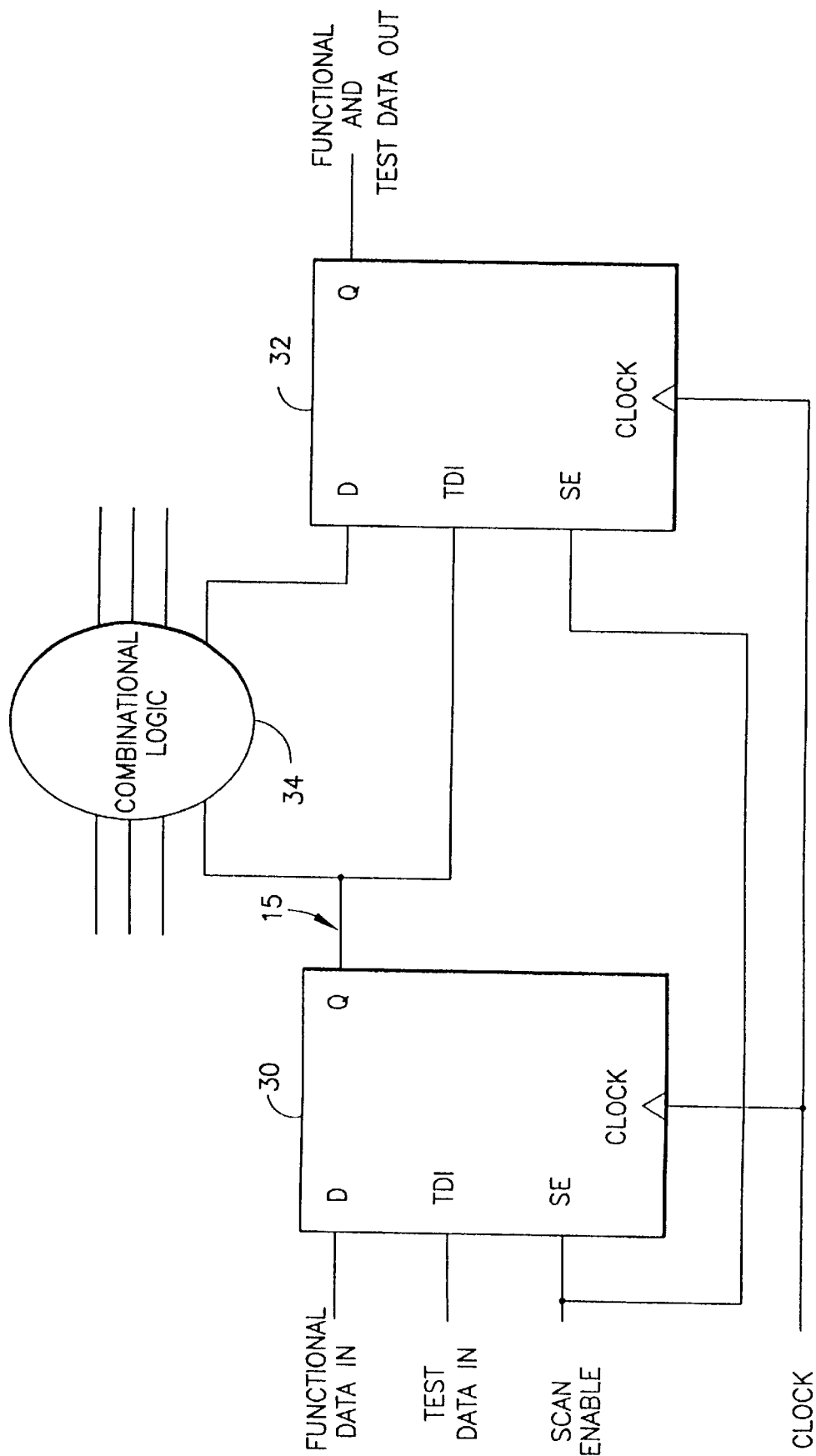
FIG. 2 is a circuit diagram showing a scan path test structure as known in the prior art.

As seen in FIG. 3, a test register 20 in accordance with the invention is provided with a separate controllable test data output TDO for coupling a test data output signal on line 16 to another test register as an input to its test data input TDI, thus forming a testable shift register.

Figure 5:
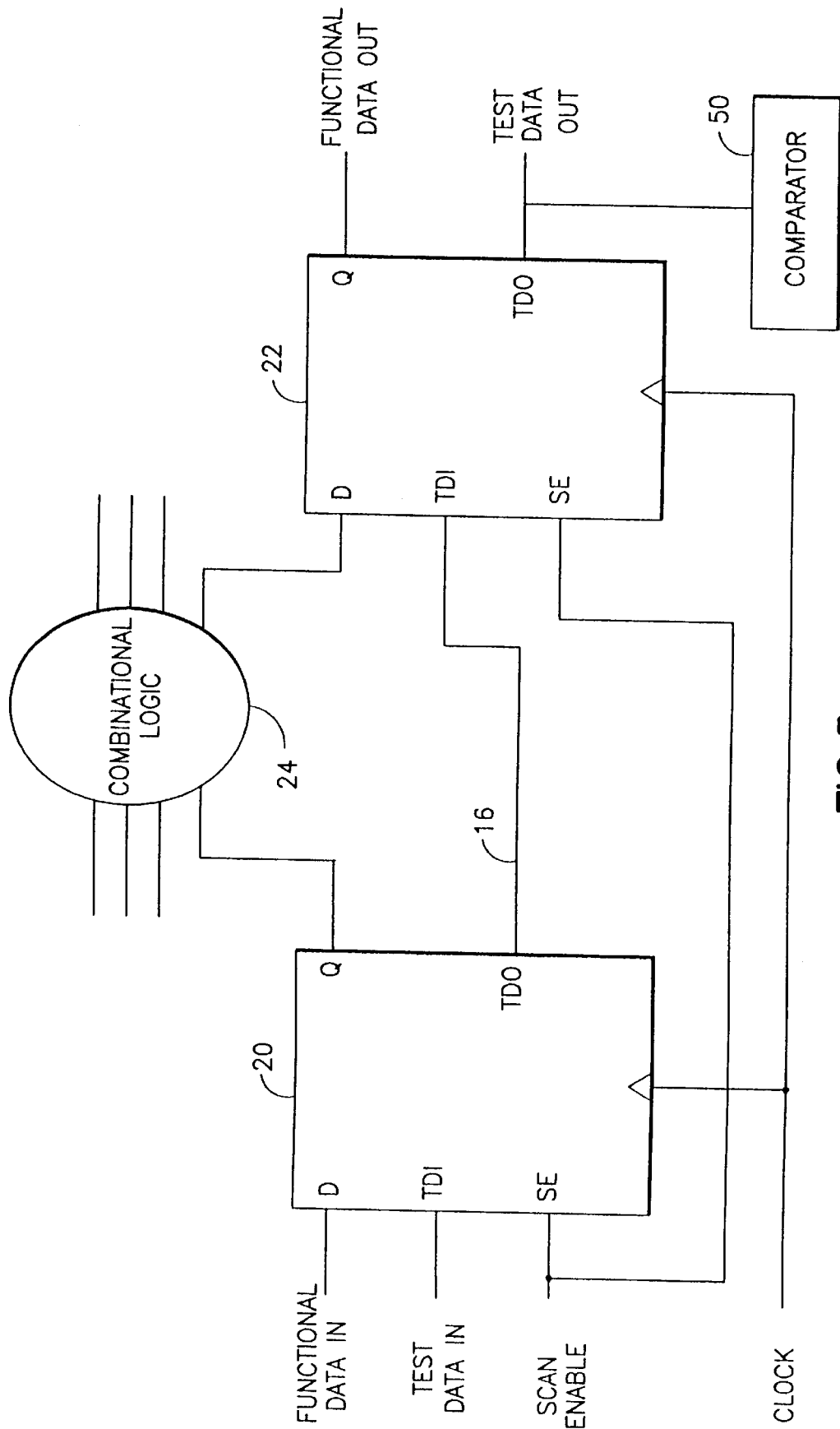
FIG. 5 is a circuit diagram showing an integrated circuit device in accordance with an embodiment of the present invention.

FIG. 5 shows an improved circuit construction of an integrated circuit device embodiment of the present invention including test data registers of the type shown in FIG. 3. Test register 20 accepts a functional data input at input D and a clock signal when operating in the functional mode. Upon the transition of the clock signal from low to high, the data level present on the D input is transferred to the output Q. When operating in the functional mode, the test data output (TDO) state does not change when the clock signal transitions. Output Q of register 20 is connected to combinatorial logic 24 in a manner that implements the desired logic function of the circuit. Register 22 accepts a signal from combinatorial logic 24. Combinatorial logic 24 also receives input signals from other parts of the logic circuit and has outputs to other parts of the logic circuit which are not shown and described in detail here as they form no part of the invention.

When operating in the scan-path mode, register 20 accepts a test data input signal at TDI and a clock signal, and transfers the data level present on the TDI input to the output Q and to test data output TDO. The TDO output signal from register 20 is coupled on line 16 to the TDI of register 22 which coupling forms a basic shift register. In order to load a desired state of registers 20 and 22, the scan enable signal to their inputs SE is asserted to enable the scan-path mode. A serial data stream representing the logic levels desired is presented to the first register of the scan chain, register 20 in this example. The clock signal is transitioned once for each data bit to serially clock the data through the registers. This operation can be extended to any number of registers (20, 22, etc.) connected in series to achieve a desired size for the shift register. The resulting state of the shift register constitutes a known initialization value, which may be in the form of all 0s, or, for example, if an internal counter is to be set to a specific value, that value may be used. At the completion of the serial load operation the registers have the desired initialized logic state. The scan enable signal is then de-asserted to put the registers back into the functional mode of operation. The clock signal is now transitioned the desired number of times to execute the circuit function and put the registers in another logic state. The value of this logic state will constitute a predictable functional value. At this point the clock is stopped, the scan enable signal is asserted again, and the clock is transitioned to serial clock the register values out the TDO of register 22, i.e., the last register in the shift register. During this shifting operation new register values may be shifted in for a subsequent test. The functional values read out of the shift register are then input to a comparator component 50 for use in a device testing operation. The values read from the registers of the given device tested are compared with the values computed or generated for a properly functioning device in the comparator component 50. Faults are indicated where the values from the device under the test differ from the expected values. When a defective device is detected in this manner, since the proper initialization and predictable values are known, it may be possible to determine exactly where the fault lies.

FIG. 4 shows the detail of a test register in accordance with the present invention. A multiplexer 42 acts as a data selector to select whether the functional data input D or the test data input TDI is passed in response to the level of the scan enable signal. The selected data input signal is passed to a flip-flop 44. When a low to high transition occurs on the clock signal the data present at the D input of flip-flop 44 is transferred to its output Q. The flip-flop 44 can alternatively be designed to be responsive to a high to low transition of the clock signal with the same result. In general, an integrated circuit will contain both forms of flip-flop. The Q output is coupled to other circuit elements as required for the operation of the circuit in the functional mode. The Q output is further connected to a gating device 46 which is enabled under control of the scan enable signal. When the scan enable signal is enabling scan-path testing, the gating device 46 passes the flip-flop Q output to the test data output TDO. The TDO of this register is connected to the TDI of other registers to form one or more shift registers as required for the operation of the circuit in the scan-path test mode.

Figure 8:
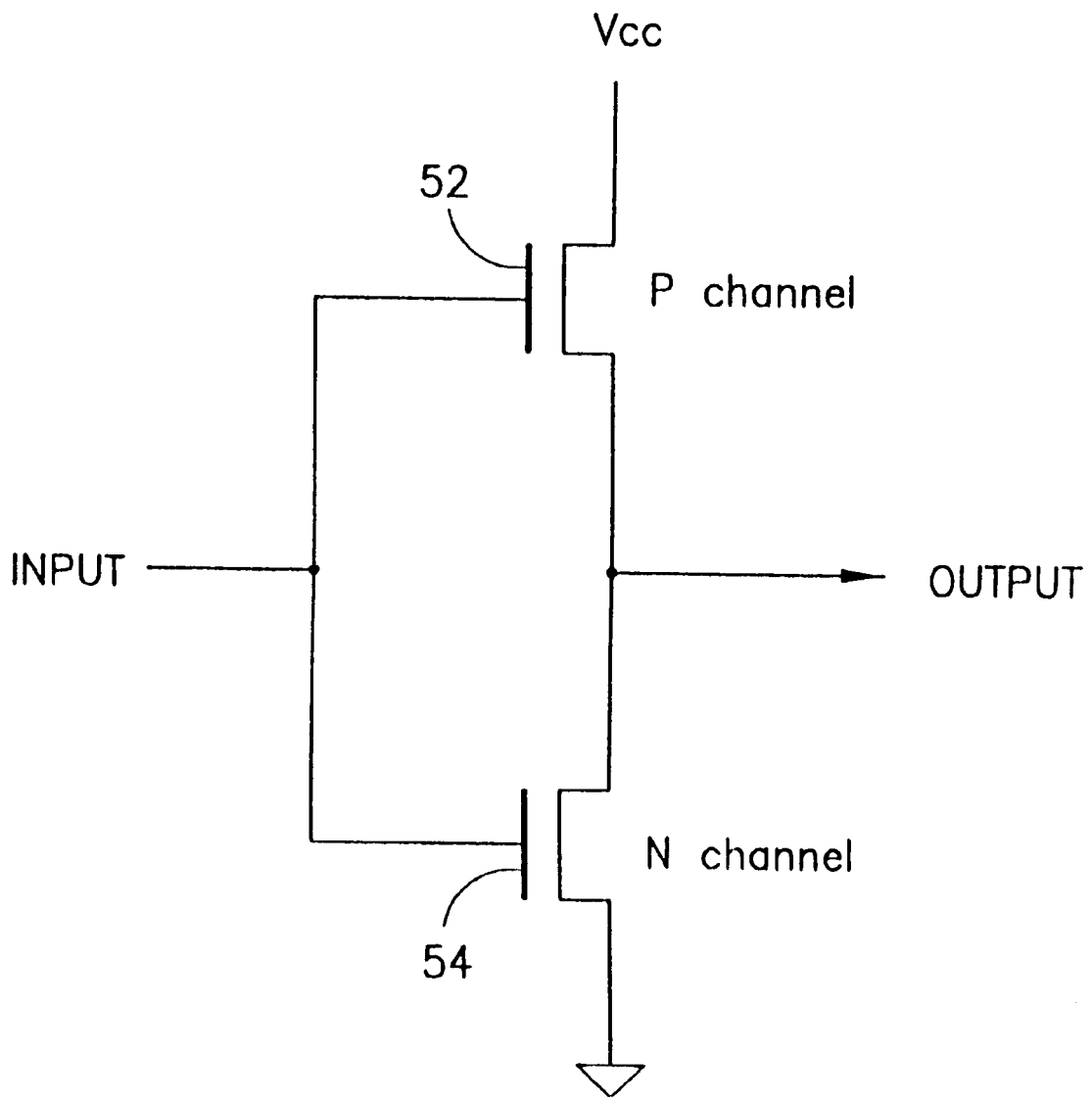
FIG. 8 is a circuit diagram of a representative integrated circuit gate showing the transistor level construction as known in the prior art.

The gating device 46 can be implemented using a MOSFET 47 as a transmission gate. An active level on the gate terminal of the MOSFET 47 will put the MOSFET 47 in a low impedance state and pass the signal. An inactive level on the gate terminal of the MOSFET 47 will put the MOSFET 47 in a high impedance state and block the signal. The TDI of the succeeding stage of the scan-path is generally a conventional MOSFET gate, such as shown in FIG. 8 having P and N channel gates 52 and 54, respectively. Such a gate must be driven to a high or low level and cannot be left in a disconnected state as would be the case when MOSFET 47 is at high impedance. For this reason a pull-up component 48 is provided in the gating device 46 to pull the inactive TDO signal to a high level. Alternatively, a pull-down component 49 can be used to pull the inactive TDO signal to a low level. Pull-up or pull-down devices can be implemented using resistors or MOS transistors as known in the art. The gating device 46 can also be implemented using AND or OR logic gates, 46' or 46", as shown in FIGS. 6 and 7, respectively. However, the transmission gate implementation of FIG. 4 has the advantage of eliminating the capacitive load associated with the input stage of the AND or OR gate implementations of FIGS. 6 and 7, thus achieving greater power dissipation savings, so that it is preferred.

What is claimed is:

1. A serial scan test structure in a MOS integrated circuit comprising:

latching means, having a data input, a select input, a test input, and a data output, for receiving a select signal at said select input and a data signal at said data input and latching said data signal to said data output when said select signal is in a first state, and for receiving a test signal at said test input and latching said test signal to said data output when said select signal is in a second state; and gating means, having a test output along with first and second inputs coupled respectively to said data output and select input of said latching means, for coupling said data output to said test output when said select input is in said second state and for decoupling said data output from said test output when said select input is in said first state, whereby said decoupling reduces power dissipation by said test signal when said select signal is in said first state.

2. The structure of claim 1 wherein said latching means comprises:

a multiplexer having a data input, a select input, a test input, and a data output, for receiving said select signal at said select input and said data signal at said data input and latching said data signal to said data output when said select signal is in a first state, and for receiving said test signal at said test input and latching said test signal to said data output when said select signal is in a second state; and a flip-flop connected between said multiplexer and said gating means for receiving said data output from said multiplexer and coupling it to said first input of said gating means.

3. The structure of claim 1 wherein said gating means comprises a transmission gate.

4. The structure of claim 1 wherein said gating means comprises a logic gate.

5. A MOS integrated circuit having a scan path capable of being tested with reduced power dissipation, comprising:

a functional block comprising:
   a functional data input for receiving a functional data signal;
   a test data input for receiving a test data signal;
   a scan enable input for receiving a scan enable signal, said scan enable signal selecting a mode of operation, said mode of operation comprising a functional mode and a test mode;
   a clock input for receiving a clock signal;
   a functional data output for outputting a functional data signal;
   a test data output for outputting a test data signal; and
   a gating circuit, responsive to said scan enable signal and connected to the functional data output, for inhibiting the output of said functional data signals and delivering a test data signal to said test data output when said test mode is selected, and inhibiting the output of said test data signals and delivering a functional data signal to said functional data output when said functional mode is selected, whereby power dissipation by said test data signal is reduced when said functional mode is selected.

6. An integrated circuit as in claim 5 further comprising:

a plurality of said functional blocks connected to each other in a predetermined manner such that the test data output of one said functional block is connected to the test data input of a successive said functional block to form a shift register, the state of which shift register is determined by said test data signal when said test mode is selected; and wherein when said functional mode is selected the state of said shift register is determined by said functional data signal and said test data signal is disabled in said shift register.

7. An integrated circuit as in claim 6 further comprising:

means for initializing said shift register by selecting said test mode to determine its state with said test data signal;

means for changing the state of said initialized shift register by selecting said functional mode to determine its state with said functional data signal; and means for reading out said changed state of said shift register and comparing said changed state with a predetermined state.

8. The circuit of claim 5 further comprising a plurality of said functional blocks connected to each other in a predetermined manner such that the test data output of one said functional block is connected to the test data input of a successive said functional block to form a shift register, and wherein said functional blocks further comprise:

means for controlling said gating circuit to output a test data signal, in response to said scan enable signal selecting said test mode, to provide an initialization state in said shift register;

means, responsive to said scan enable signal selecting said functional mode after said test mode has provided an initialization state in said shift register, to replace said initialization state with a functional data state by providing functional data signals to said shift register; and means for reading out the value of said functional data state from said shift register and comparing said functional data state value with a preselected value indicative of a desired functional data state.

9. The circuit of claim 5 wherein said gating circuit comprises one of a transmission gate and a logic gate.

10. A method of reducing power dissipation in a MOS integrated circuit, comprising functional blocks including test registers using scan chains, comprising the steps of:

enabling a test mode of operation in said functional blocks and disabling a functional mode of operation;

producing test data output signals from separate test data outputs provided in said functional blocks during said test mode of operation;

clocking serial data through said test registers of said functional blocks by connecting said functional blocks in a predetermined manner to form a scan chain comprising a test data path for said test data output signals to produce an initialized test state of said test registers;

disabling the test mode of operation to disable the operation of said test path and enabling the functional mode of operation; and producing functional data output signals from said functional blocks during said functional mode of operation;

clocking serial data through said test registers connected in a second predetermined manner forming a functional data path for said functional data output signals to produce a functional test state of said test registers; and reading out the value of said functional test state from said test registers and comparing it with a value of a desired functional state, whereby with said test path operation being disabled during said functional mode of operation power dissipation in said scan chain is reduced.

11. The method of claim 10 wherein said functional blocks are provided with separate test data inputs and said test data path is formed in a predetermined manner by connecting said separate test data outputs to said separate test data inputs in successive functional blocks.

12. The method of claim 10 wherein said functional blocks are provided with separate functional data outputs and functional data inputs and said functional data path is formed in said second predetermined manner by connecting said separate functional data outputs to said separate functional data inputs in successive functional blocks.

13. The method of claim 10 wherein said step of enabling a test mode of operation in said functional blocks and disabling a functional mode of operation comprises supplying a scan enable select signal to a multiplexer in each of said functional blocks.

14. The method of claim 10 wherein said steps of clocking serial data through said test registers comprise supplying a scan enable select signal to a gating circuit in each of said functional blocks.

15. A MOS integrated circuit test register comprising:

selecting means, responsive to a selecting signal, for selecting between a functional signal and a test signal and outputting the selected one of the functional and test signals;

register means, coupled to said selecting means, for receiving the selected one of the functional and test signals and storing a digital data value therefor;

gating means, coupled to said register means, for enabling signal transitions and responsive to said selected one of the functional and test signals to enable signal transitions when said test signal is selected and disable said signal transitions when said functional signal is selected; and means for comparing the values read from the registers with values generated by a properly functioning device to determine if there are differences.

16. An integrated circuit test register as in claim 15 wherein said selecting means comprises a multiplexer.

17. An integrated circuit test register as in claim 15 wherein said register means comprises a flip-flop circuit.

18. An integrated circuit test register as in claim 15 wherein said gating means comprises a transmission gate.

19. An integrated circuit test register as in claim 15 wherein said gating means comprises a logic gate.

20. An integrated circuit test register as in claim 15 wherein said gating means comprises means for inputting said selecting signal thereto.

* * * * *